(12) United States Patent
Farrar

(10) Patent No.: US 7,052,987 B2
(45) Date of Patent: May 30, 2006

(54) METHOD FOR FABRICATING A LOW CAPACITANCE WIRING LAYOUT

(75) Inventor: Paul A. Farrar, South Burlington, VT (US)

(73) Assignee: Micron Technology, Inc., Boise, ID (US)

( * ) Notice: Subject to any disclaimer, the term of this patent is extended or adjusted under 35 U.S.C. 154(b) by 19 days.

(21) Appl. No.: 10/842,455

(22) Filed: May 11, 2004

(65) Prior Publication Data

US 2004/0207090 A1     Oct. 21, 2004

Related U.S. Application Data

(62) Division of application No. 10/337,850, filed on Jan. 8, 2003, now Pat. No. 6,812,571, which is a division of application No. 09/638,390, filed on Aug. 15, 2000, now Pat. No. 6,522,011.

(51) Int. Cl.
  *H01L 21/4763* (2006.01)
(52) U.S. Cl. ............... 438/622; 438/666; 438/674; 438/687
(58) Field of Classification Search ............... 438/622, 438/623, 624, 631, 666, 674, 675, 687
See application file for complete search history.

(56) References Cited

U.S. PATENT DOCUMENTS

| 4,770,899 | A | * | 9/1988 | Zeller ..................... 427/96.2 |
| 5,289,037 | A |   | 2/1994 | Savignac et al. |
| 5,378,927 | A |   | 1/1995 | McAllister et al. |
| 5,434,452 | A |   | 7/1995 | Higgins, III |
| 5,476,817 | A | * | 12/1995 | Numata ..................... 438/619 |
| 5,532,518 | A |   | 7/1996 | Hakey et al. |
| 5,854,128 | A |   | 12/1998 | Ma et al. |
| 6,060,176 | A |   | 5/2000 | Semkow et al. |
| 6,069,067 | A | * | 5/2000 | Kinugawa ................. 438/622 |
| 6,143,641 | A |   | 11/2000 | Kitch |

FOREIGN PATENT DOCUMENTS

JP          04113625 A   *   4/1992

OTHER PUBLICATIONS

Mark T. Bohr, *Interconnect Scaling—The Real Limiter to High Performance ULSI*, IEEE, 1995, IEDM Tech. Digest, pp. 241-244.

P. Wrschka, J. Hernandez, G. S. Oehrlein, and J. King, *Chemical Mechanical Planarization of Copper Damascene Structures*, J. Electrochem. Soc., vol. 147, No. 2, May 2000, pp. 706-712.

* cited by examiner

*Primary Examiner*—Stephen W. Smoot
(74) *Attorney, Agent, or Firm*—Dickstein Shapiro Morin & Oshinsky LLP

(57) ABSTRACT

Integrated circuits having multi-level wiring layouts designed to inhibit the capacitive-resistance effect, and a method for fabricating such integrated circuits, is described. The integrated circuits have at least two planes of wiring adjacent to each other and extending in the same direction. One embodiment may further include a larger than normal insulator material between planes of wiring extending in one direction and at least one plane of wiring extending in a second direction transverse to the first direction. Each of the wiring channels in a wiring plane may be offset relative to a respective wiring channel in the next adjacent wiring plane which extends in the same direction.

8 Claims, 9 Drawing Sheets

METHOD FOR FABRICATING A LOW CAPACITANCE WIRING LAYOUT

This application is a division of U.S. Ser. No. 10/337,850, filed Jan. 8, 2003, now U.S. Pat. No. 6,812,571, which is a division of U.S. Ser. No. 09/638,390, filed Aug. 15, 2000, now U.S. Pat. No. 6,522,011, both of which are incorporated herein by reference.

FIELD OF THE INVENTION

The present invention relates generally to integrated circuit fabrication, and more particularly to a wiring layout which allows for a relatively high heat conductivity for a given capacitive-resistance load.

BACKGROUND

Multi-level wiring in integrated circuits is well known in the industry. In the early days of the semiconductor industry, nearly all of the resistance and the capacitive load in a circuit were in devices. As devices have grown smaller and the wiring cross-sections have been reduced, the capacitive load of the wiring structure and the line resistivity have grown to the point that they are the largest contributors to the total capacitive-resistance load on a device. Today, a major problem in the semiconductor processing industry is the capacitive-resistance effect in the wiring levels. Efforts to reduce the resistance of the wiring levels and to lower the capacitive loading on the wiring levels have met with poor results.

Conventionally, aluminum and aluminum alloys have been used for wiring integrated circuits. Aluminum, however, has a poor conductivity compared with other metals. Copper has also been used. However, copper, unlike aluminum, cannot be reactively ion etched. To be reactively ion etched, the object being etched must form a volatile compound at room temperature, and copper does not do so. Thus, wires, or lines, of copper must be formed in a damascene process. In the damascene process, a layer of insulating material is first deposited and patterned by reactive ion etching to form trenches. The conductor material, here copper, is deposited above a liner and adhesion layer within the trenches. Generally, the copper is deposited by either chemical vapor deposition (CVD) or electroplating. Any unwanted copper and liner may be removed by chemical mechanical polishing (CMP).

As lithographic dimensions decrease, the capacitive-resistance problem is increasing. The capacitive-resistance problem is affected by wires located in the same horizontal plane as well as by wires vertically separated. The capacitive effect of wires within the same plane is most directly affected by smaller lithographic dimensions. The horizontal and vertical capacitive effects can be mitigated to some extent by making the wiring thinner. Thinning the wiring, however, reduces the cross-section of the wiring, thereby increasing its resistance. Further, the vertical capacitive effect can be mitigated by increasing the thickness of the insulative material in which the various wiring layers are deposited. The insulative materials generally used have a low coefficient of thermal conductivity, thereby reducing the heat flow to the top surface of the integrated circuit, causing the integrated circuit to operate at a higher than desired temperature or a reduced power level to avoid an overheating problem.

Another solution to heat generation and dissipation is to make the wiring wider to increase the conductivity and/or electromigration resistance of the wiring. This, however, requires additional wiring planes, which consequently requires additional levels of insulative material, thereby reducing the ability to remove heat from the integrated circuit.

FIGS. 1–6 are exemplary depictions of conventional multiple level wiring layouts which have been used in integrated circuit designs. FIGS. 1–6 show a portion of an integrated circuit have wiring channels running in a first direction at a first level interspersed with wiring channels at a second level running in a second direction perpendicular to the first direction. With specific reference to FIGS. 1–2, an integrated circuit portion 10, which includes a substrate 13, is shown having a top surface 12, a bottom surface 14, a first side surface 16, a second side surface 18, a third side surface 20, and a fourth side surface 22. A first plane of wiring 30 and a third plane of wiring 34 extend from the first side surface 16 to the third side surface 20. A second plane of wiring 32 and a fourth plane of wiring 36 extend from the second side surface 18 to the fourth side surface 22. Each of the wiring planes 30, 32, 34, 36 includes one or more wiring channels 38 into which are deposited conductive wires 40. The wires may be formed of any conductive material, and are preferably formed of copper.

Each of the wiring planes 30, 32, 34, 36 is set within and separated by an insulator material, such as an intralayer dielectric 42. As shown, the second plane of wiring 32 is positioned between the first and third planes of wiring 30, 34, while the fourth plane of wiring 36 is beneath the third plane of wiring 34. The width of each of the wiring channels 38 is generally equivalent to the height of the channels 38, and the pitch is, for example, twice as long as either the height or the width of the channels 38.

FIG. 3 illustrates another integrated circuit 100 having an alternative wiring layout configuration. The major difference between integrated circuit 100 and integrated circuit 10 is the configuration of the wiring channels, and hence the configuration of the wiring itself. Wiring channels 138 have a height twice that of the width of the channels 138, and hence the wiring 140 has a greater height than width.

FIG. 4 illustrates another integrated circuit 200 having a plurality of channels 238 into which wiring 240 is deposited. Channels 238 have a height to width ratio of four to one.

FIG. 5 illustrates another integrated circuit 300 having an additional four planes of wiring beneath the four planes of wiring 30, 32, 34, 36. Specifically, beneath the fourth plane of wiring 36 is a fifth plane of wiring 331 which extends in a direction parallel to the first and third planes of wiring 30, 34, namely from the first side surface 16 to the third side surface 20. Beneath the fifth plane of wiring 331 are a sixth plane 333, a seventh plane 335, and an eighth plane 337. The seventh plane of wiring 335 extends from the first side surface 16 to the third side surface 20, while the sixth and eighth planes of wiring 333, 337 extend from the second side surface 18 to the fourth side surface 22. As with the first four planes of wiring 30, 32, 34, 36, the second four planes of wiring 331, 333, 335, 337 are interspersed such that each plane does not extend in the same direction as adjacent planes.

FIG. 6 illustrates another integrated circuit 400 which is similar to integrated circuit 300 (FIG. 5). The difference is that each of the wiring channels 38 in a single plane of wiring is offset relative to the next closest wiring plane extending in the same direction. For example, the wiring channels 38 in the first wiring plane 30 are offset relative to the channels 38 in the third wiring plane 34. Further, the channels 38 in a fifth wiring plane 431 are offset relative to the channels 38 in a seventh wiring plane 435, and channels 38 in a sixth wiring plane 433 are offset relative to those in an eighth wiring plane 437.

The wiring layouts illustrated in FIGS. 1–6 all have capacitive-resistance effects. The capacitive-resistance effect (RC) of the integrated circuit 10 of FIGS. 1–2 can be expressed by the equation $$RC = 2r\acute{\epsilon}\epsilon_o L^2(4/p^2 + 1/T^2),$$

where r equals interconnect resistivity, $\epsilon_o$ equals permittivity of free space, $\epsilon$ equals the dielectric constant of the insulator material, L is the interconnect length, p is the interconnect pitch, and T is the interconnect thickness. The interconnect resistivity r is a function of the material from which the wire is formed, and cannot be increased as the pitch and/or the thickness of the wire is reduced. It is also assumed that the thickness of the insulator material between the wiring planes is equal to the thickness of the wiring 40, and the width of the wiring 40 is equal to one half the pitch.

Reduction and dissipation of heat caused by current flow in the wiring in an integrated circuit is, as noted, an increasingly important issue. To obtain additional heat conductivity, and thereby remove/reduce heat effects, the wiring can be made thicker. Thicker wires leads, however, to an undesirable increase in capacitance loading and an increase in the total RC.

There exists a need for a multi-level wiring layout, and a method for making the same, which allows for increased heat dissipation while maintaining relatively low capacitive-resistance values.

SUMMARY

The invention provides an integrated circuit that includes a first set of two or more adjacent wiring planes extending in a first direction, each of the wiring planes having at least one wiring channel into which is deposited a conductive element. In one aspect, the wiring channels of adjacent wiring planes are offset from one another.

The invention also provides a method for fabricating an integrated circuit having a plurality of wiring planes, each of the planes including a plurality of wiring channels. The method includes providing a first layer of insulator material, masking the first layer of insulator material and etching a first plurality of the wiring channels in a first direction, filling the first plurality of wiring channels with conductive material, providing a second layer of insulator material adjacent to the first layer of insulator material, providing a third layer of insulator material adjacent to the second layer of insulator material, masking the third layer of insulator material and etching a second plurality of the wiring channels in the first direction, the second plurality of wiring channels being offset from the first plurality of wiring channels, and filling the second plurality of wiring channels with conductive material.

These and other advantages and features of the invention will be more readily understood from the following detailed description which is provided in connection with the accompanying drawings.

DETAILED DESCRIPTION OF THE PREFERRED EMBODIMENTS

Figure 1:
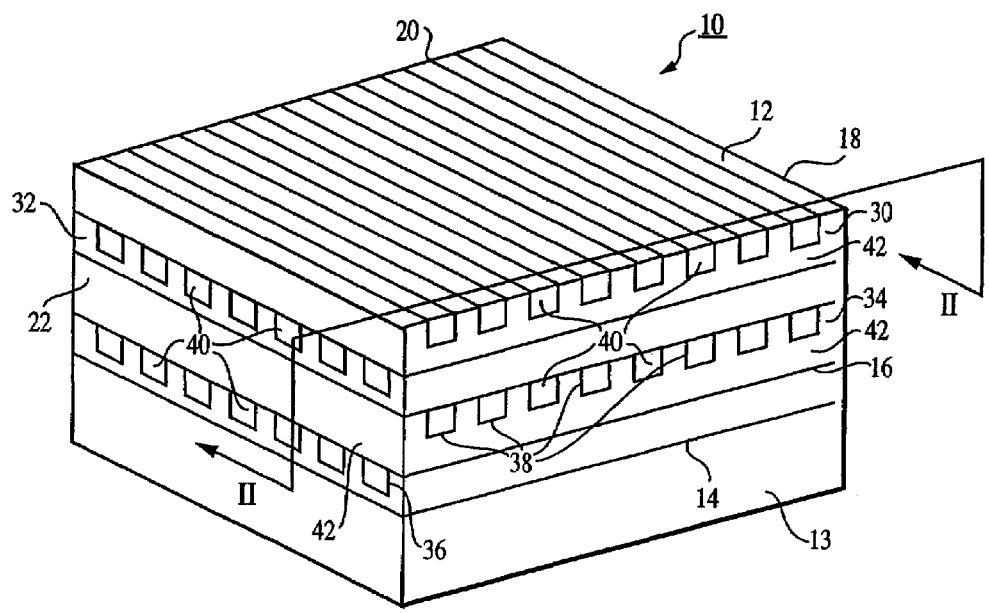
FIG. 1 is a perspective view of a conventional integrated circuit wiring pattern.
Figure 7:
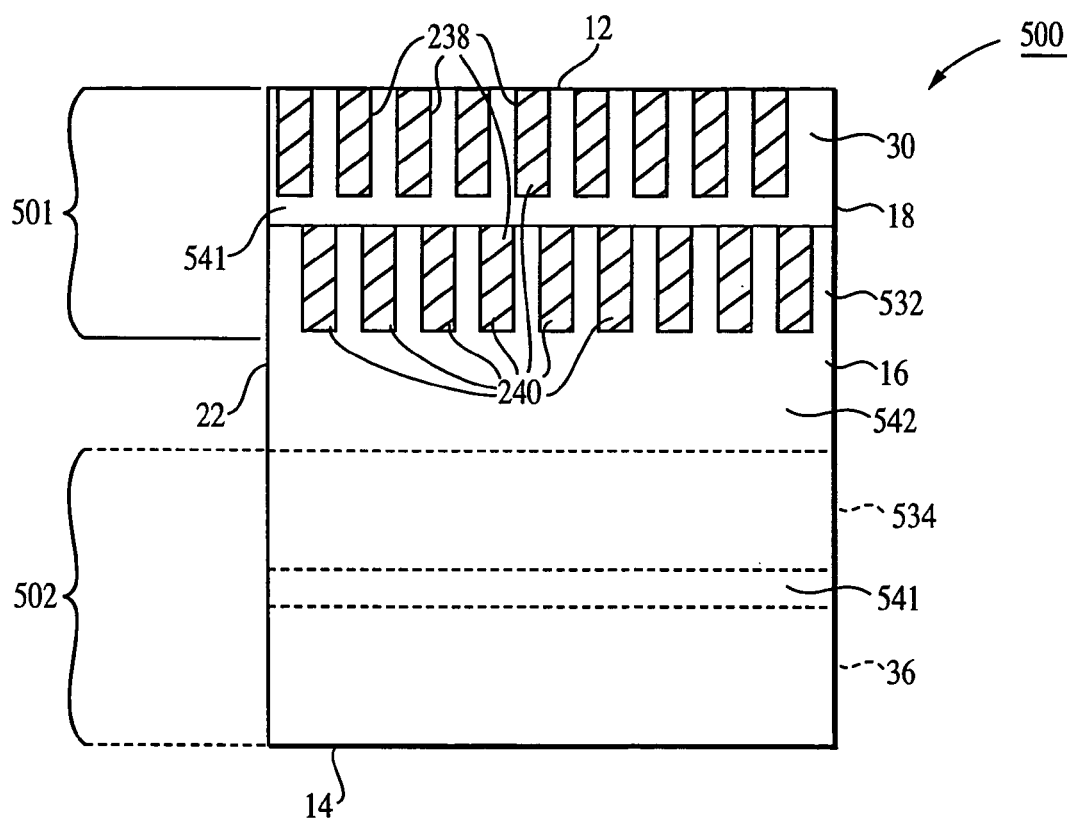
FIG. 7 is a cross-sectional view of an integrated circuit wiring pattern fabricated in accordance with a first exemplary embodiment of the invention.

Referring now to FIG. 7, there is shown a portion of an integrated circuit 500 in a first exemplary embodiment of the invention. The integrated circuit 500 has an upper surface 12, a lower surface 14, and first through fourth side surfaces 16, 18, 20 (FIG. 1), and 22. The circuit 500 has four planes of wiring, namely a first plane of wiring 30, a second plane of wiring 532, a third plane of wiring 534 and a fourth plane of wiring 36, each positioned within an insulator material layer. The first and fourth planes of wiring 30, 36 are similar to and extend in the same direction as the first and fourth planes of wiring illustrated in FIG. 1. The second plane of wiring 532 is immediately adjacent and below the first plane of wiring 30. The first and second planes of wiring 30, 532, which extend in the same direction, make up a first set of wiring planes 501. The third plane of wiring 534 extends perpendicular to the second plane of wiring 532 and is parallel to the fourth plane of wiring 36, and the third and fourth planes 534, 36 make up a second set of wiring planes 502.

Wiring channels 238 in each of the planes of wiring have a height to width ratio of about four to one. Conductive material 240 is deposited in each wiring channel 238. Further, each of the wiring channels 238 in one of the wiring planes, e.g. 30, is offset from the wiring channels 238 in the other wiring plane extending in the same direction by an amount equal to or about one half of the wiring pitch. A first insulator material, such as an intralayer dielectric material 541, is positioned between the first and second wiring planes 30, 532 and between the third and fourth planes 534, 36. The first insulator material 541 is about one half of the wire pitch. The insulator materials 541 can be thinner due to the offset nature of the wiring channels 238 between wiring planes.

A thicker second insulator material, such as an intralayer dielectric material 542, is positioned between the second and third planes 532, 534. The thickness of the insulator material 542 is about equal to the thickness of the wiring. The insulator material 542 is thicker to reduce the capacitive-resistance effect between the second plane of wiring 532 and the third plane of wiring 534, which extends in a direction perpendicular to the second plane of wiring 532.

Figure 8:
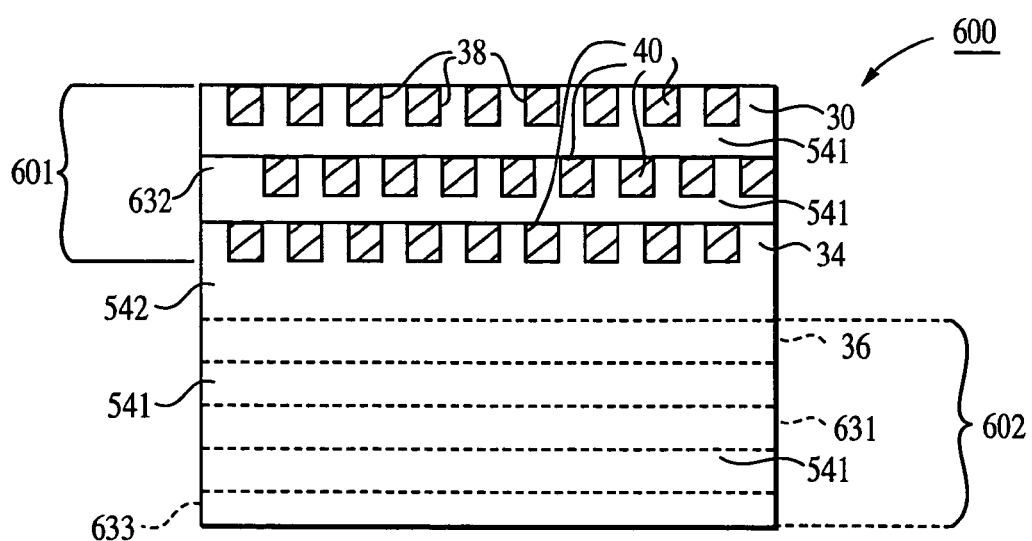
FIG. 8 is a cross-sectional view of an integrated circuit wiring pattern fabricated in accordance with a second exemplary embodiment of the invention.

FIG. 8 illustrates a portion of an integrated circuit 600 having six planes of wiring, each including a plurality of wiring channels 38. The first, second and third wiring planes 30, 632, 34 extend in the same direction and make up a first set of wiring planes 601. The wiring channels 38 of the second wiring plane 632 are offset relative to the wiring channels 38 of the first and third wiring planes 30, 34 by an amount equal to or about one half of the wire pitch. A first intralayer dielectric material 541 is positioned between the first and second planes of wiring 30, 632 and the second and third planes of wiring 632, 34.

The integrated circuit 600 further includes a fourth, fifth and sixth wiring planes 36, 631, 633, each extending in the same direction and in a direction perpendicular to the first three planes of wiring 30, 632, 34. The fourth, fifth and sixth wiring planes make up a second set of wiring planes 602. As with the first three planes of wiring, an intralayer dielectric material 541 is located between the fourth and fifth planes of wiring 36, 631 and between the fifth and sixth planes of wiring 631, 633. A thicker second intralayer dielectric material 542 is located between the third and fourth planes of wiring 34, 36. The wiring channels 38 of the fifth wiring plane 631 are offset relative to the wiring channels 38 of the fourth and sixth wiring planes 36, 633 by an amount equal to or about one half of the wire pitch. The second intralayer dielectric material 542 inhibits the capacitive-resistance effect between the wiring planes extending in a first direction and the wiring planes extending in a second direction perpendicular to the first direction.

Figure 9:
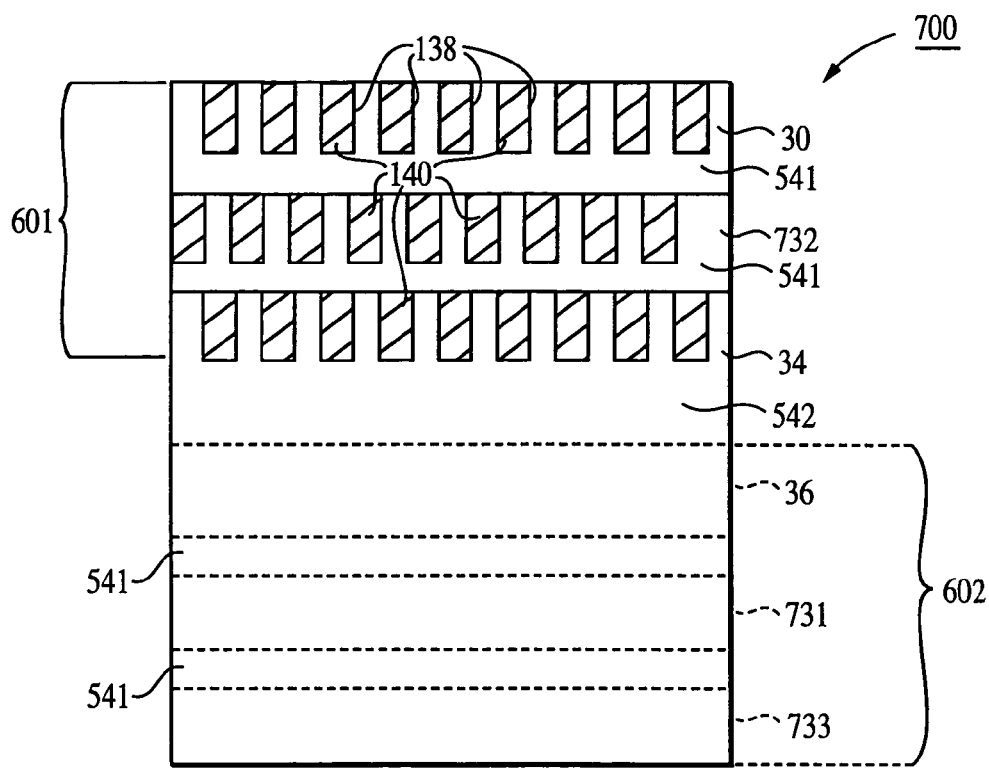
FIG. 9 is a cross-sectional view of an integrated circuit wiring pattern fabricated in accordance with a third exemplary embodiment of the invention.

FIG. 9 illustrates a portion of an integrated circuit 700 which, like the integrated circuit 600 of FIG. 8, has six planes of wiring. The difference between the circuit 600 and the circuit 700 is that the circuit 700 includes wiring channels 138 which have a height to width ratio of two to one. The first three planes of wiring 30, 732, 34, making up the first set of wiring planes 601, extend in the same direction and are separated by a first intralayer dielectric material 541. The fourth, fifth and sixth planes of wiring 36, 731, 733, making up the second set of wiring planes 602, extend in the same direction and in a direction perpendicular to the first three planes of wiring 30, 732, 34. The first intralayer dielectric material 541 separates the fourth and fifth planes of wiring 36, 731 and the fifth and sixth planes of wiring 731, 733, while a thicker second intralayer dielectric material 542 separates the first three planes of wiring from the second three planes of wiring. As with the circuit 600, the wiring channels 138 of the second plane of wiring 732 are offset from the wiring channels 138 of the first and third wiring planes 30, 34 by an amount equal to or about one half of the wire pitch, and the wiring channels 138 of the fifth wiring plane 731 are offset from the wiring channels 138 of the fourth and sixth wiring planes 36, 733 by an amount equal to or about one half of the wire pitch.

Figure 10:
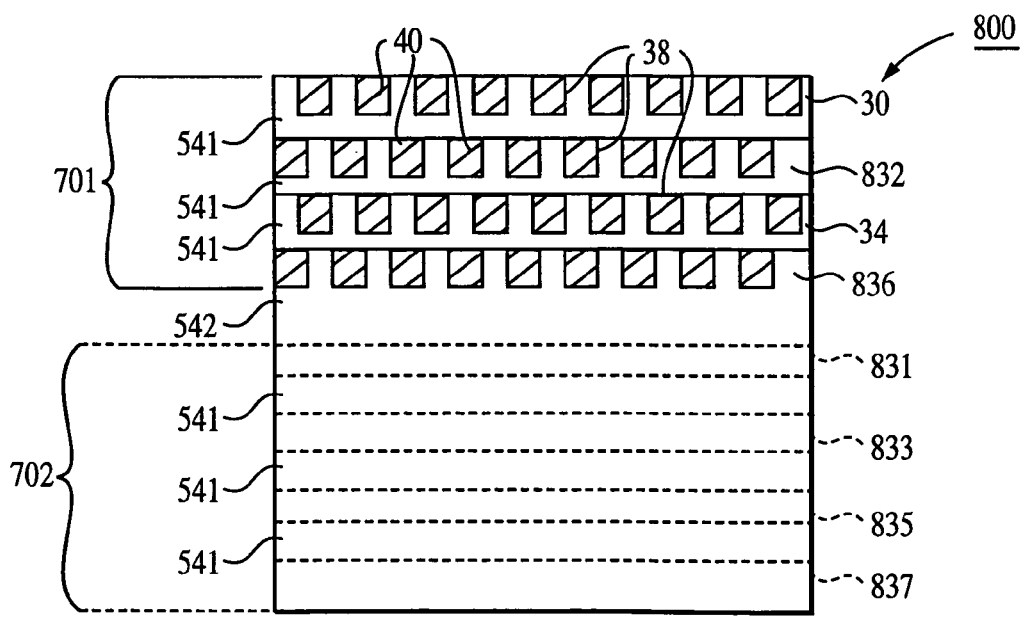
FIG. 10 is a cross-sectional view of an integrated circuit wiring pattern fabricated in accordance with a fourth exemplary embodiment of the invention.

FIG. 10 illustrates a portion of an integrated circuit 800 with eight planes of wiring, each having a plurality of wiring channels 38 with a height to width ratio of one to one. The first four planes of wiring 30, 832, 34, 836, which make up the first set of wiring planes 701, extend in the same direction and in a direction perpendicular to the next four planes of wiring 831, 833, 835, 837. Each of the first four planes of wiring 30, 832, 34, 836 is separated by a first intralayer dielectric material 541. Each of the second four planes of wiring 831, 833, 835, 837, which make up a second set of wiring planes 702, also is separated by a first intralayer dielectric material 541, and the fourth plane of wiring 836 is separated from the fifth plane of wiring 831 by a thicker second intralayer dielectric material 542. The wiring channels 38 of the second and fourth planes of wiring 832, 836 are offset from the first and third planes of wiring 30, 34 by an amount equal to or about one half of the wire pitch. The wiring channels 38 of the sixth and eighth planes of wiring 833, 837 are offset from the fifth and seventh planes of wiring 831, 835 by an amount equal to or about one half of the wire pitch.

Figure 2:
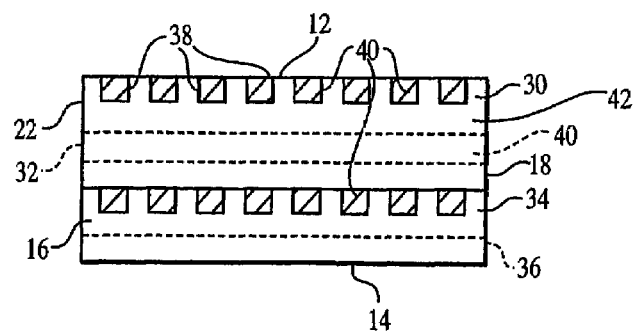
FIG. 2 is a cross-sectional view of the circuit of FIG. 1 taken along line II—II.
Figure 3:
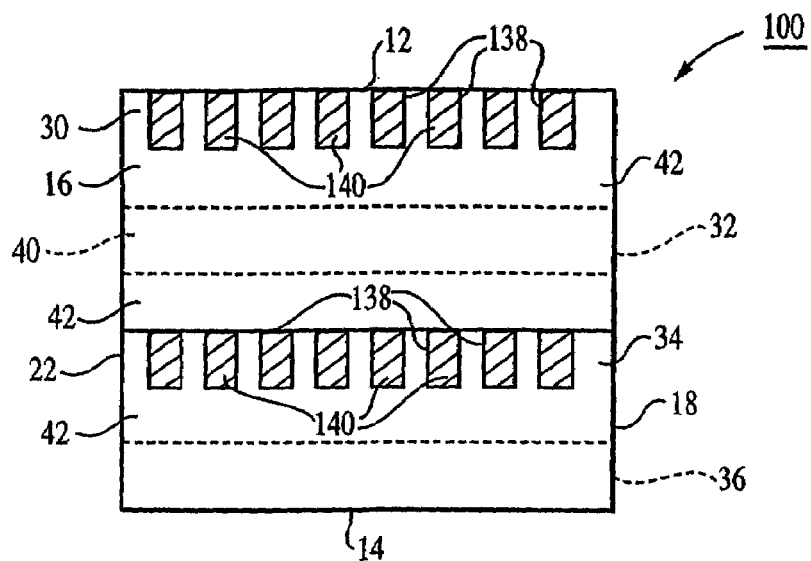
FIG. 3 is a cross-sectional view of another conventional integrated circuit wiring pattern.
Figure 4:
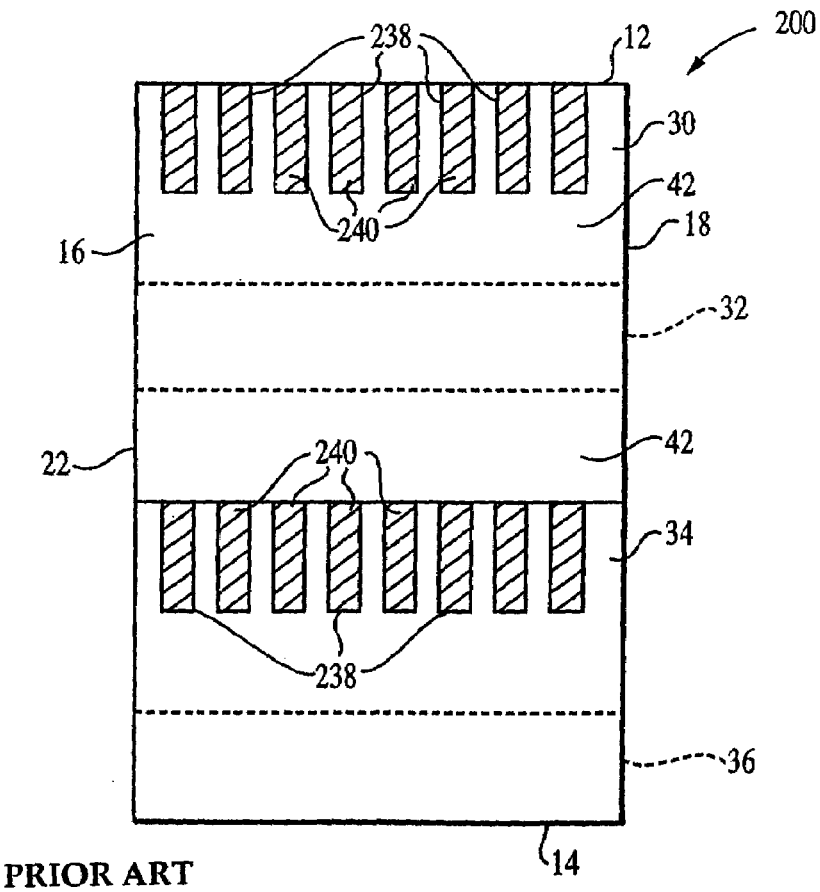
FIG. 4 is a cross-sectional view of another conventional integrated circuit wiring pattern.
Figure 5:
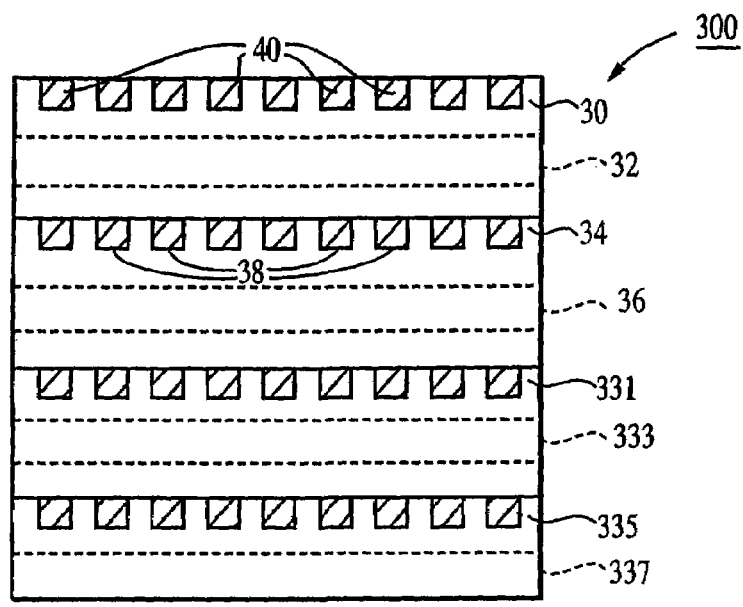
FIG. 5 is a cross-sectional view of another conventional integrated circuit wiring pattern.
Figure 6:
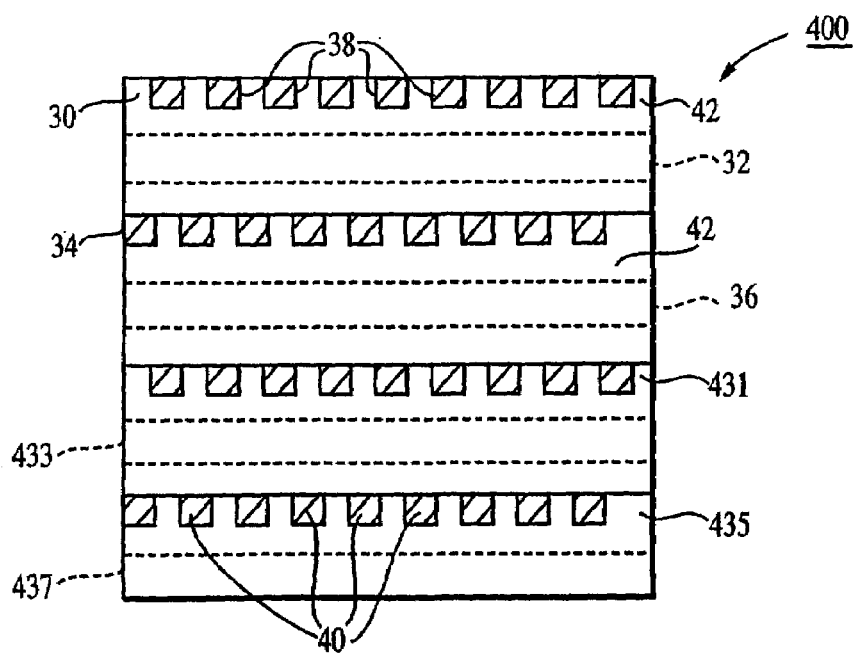
FIG. 6 is a cross-sectional view of another conventional integrated circuit wiring pattern.

By placing two or more planes of wiring extending in the same direction as one another, and by offsetting the respective wiring channels and locating thinner intralayer dielectric material therebetween, the capacitive-resistance effect is inhibited while the heat conductivity of the circuit is enhanced. Table 1 below illustrates the relative capacitive-resistance value and the relative heat conductance value of each of the integrated circuits illustrated in FIGS. 3–10 as compared to the integrated circuit illustrated in FIGS. 1–2. Each of the integrated circuits in Table 1 includes wiring comprising copper and insulative material formed of SiLK, made by Dow.

TABLE 1

| Integrated Circuit (FIG. No) | Number of Metal Levels | Metal Thickness (T) | Metal Pitch (p) | Relative Capacitive-Resistance (RC) | Relative Heat Conductivity |
|---|---|---|---|---|---|
| 10 (FIGS. 1–2) | 4 | 1 | 2 | 1.0 | 1.0 |
| 100 (FIG. 3) | 4 | 2 | 2 | 0.63 | 0.71 |
| 200 (FIG. 4) | 4 | 4 | 2 | 0.53 | 0.29 |
| 300 (FIG. 5) | 8 | 2 | 4 | 0.25 | 0.29 |
| 400 (FIG. 6) | 8 | 2 | 4 | 0.25 | 0.29 |
| 500 (FIG. 7) | 4 | 4 | 2 | 0.53 | 0.5 |
| 600 (FIG. 8) | 6 | 1.5 | 3 | 0.44 | 0.83 |
| 700 (FIG. 9) | 6 | 2.66 | 3 | 0.28 | 0.46 |
| 800 (FIG. 10) | 8 | 2 | 4 | 0.25 | 0.45 |

From the table above, it is shown that the wiring layouts of FIGS. 7–10 result in a higher heat conductivity for a given amount of wiring channels 38 while achieving a low capacitive-resistance effect RC. For example, the integrated circuit 200 of FIG. 4 has a relative RC of 0.53 and a relative heat conductance of 0.29, while the integrated circuit 500 (FIG. 7) has a relative RC of 0.53 and a relative heat conductance of 0.50. Further, integrated circuits 300, 400 each have a relative RC of 0.25 and a relative heat conductance of 0.29, while integrated circuit 800 has a relative RC of 0.25 and a relative heat conductance of 0.45.

Table 2 on the following page includes calculated capacitive-resistance effect RC (pico-$\Omega C^2$/Nm) and heat conductivity (w/m° K) based upon the equation $RC=2r\epsilon\epsilon_o L^2(4/p^2+1/T^2)$. The dielectric used is Dow SiLK. The $\epsilon$ equals 2.65 with a heat conductivity of 0.19 w/m° K. The $\epsilon_o$ equals the permittivity of vacuum ($8.85\times10^{-12}$). The conductor is copper with a resistivity r of 16.73 nano-ohm meter, and.

TABLE 2

| Integrated Circuit (FIG. No) | Number of Metal Levels | Metal Thickness (T) | Metal Pitch (p) | Capacitive-Resistance RC | Heat Conductivity (w/m° K) |
|---|---|---|---|---|---|
| 10 (FIGS. 1–2) | 4 | 1 | 2 | 0.0157 | 0.0356 |
| 10 (FIGS. 1–2) | 4 | 0.1 | 0.2 | 1.57 | 0.356 |
| 100 (FIG. 3) | 4 | 2 | 2 | 0.0099 | 0.0253 |

TABLE 2-continued

| Integrated Circuit (FIG. No) | Number of Metal Levels | Metal Thickness (T) | Metal Pitch (p) | Capacitive-Resistance RC | Heat Conductivity (w/m° K) |
|---|---|---|---|---|---|
| 100 (FIG. 3) | 4 | 0.2 | 0.2 | 0.99 | 0.253 |
| 200 (FIG. 4) | 4 | 4 | 2 | 0.0083 | 0.0103 |
| 200 (FIG. 4) | 4 | 0.4 | 0.2 | 0.83 | 0.103 |
| 300 (FIG. 5) | 8 | 2 | 4 | 0.0039 | 0.0103 |
| 300 (FIG. 5) | 8 | 0.2 | 0.4 | 0.39 | 0.103 |
| 400 (FIG. 6) | 8 | 2 | 4 | 0.0039 | 0.0103 |
| 400 (FIG. 6) | 8 | 0.2 | 0.4 | 0.39 | 0.103 |
| 500 (FIG. 7) | 4 | 4 | 2 | 0.0083 | 0.0178 |
| 500 (FIG. 7) | 4 | 0.4 | 0.2 | 0.83 | 0.178 |
| 600 (FIG. 8) | 6 | 1.5 | 3 | 0.0069 | 0.0295 |
| 600 (FIG. 8) | 6 | 0.15 | 0.3 | 0.69 | 0.295 |
| 700 (FIG. 9) | 6 | 2.66 | 3 | 0.0044 | 0.0164 |
| 700 (FIG. 9) | 6 | 0.266 | 0.3 | 0.44 | 0.164 |
| 800 (FIG. 10) | 8 | 2 | 4 | 0.0039 | 0.016 |
| 800 (FIG. 10) | 8 | 0.2 | 0.4 | 0.39 | 0.16 |

Multi-level integrated circuits, such as, for example, integrated circuits 500–800, are structured in a way making them particularly suited for being manufactured with a dual, triple, or quadruple damascene process, as will be described below.

Additional wiring layouts which are within the scope of the invention are illustrated in FIGS. 11–30. The additional wiring layouts have been simplified merely for ease of illustration. Although the wiring layouts have been shown and described in reference to integrated circuits, it is to be understood that similar wiring layouts as shown in FIGS. 7–30 may be formed on a larger scale for printed circuit boards.

Figure 11:
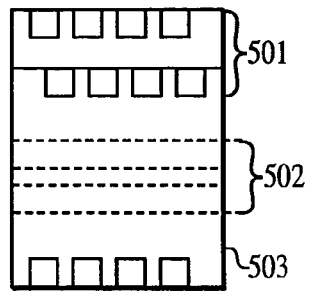
FIGS. 11–30 are schematic views of integrated circuit wiring patterns fabricated in accordance with additional exemplary embodiments of the invention.
Figure 12:
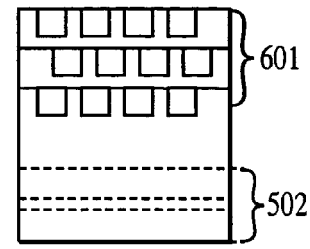

FIGS. 11–12 illustrate two examples of five wiring planes laid down according to the invention. FIG. 11 shows a set 501 of two wiring planes separated from a set 503 having a single wiring plane by a set 502 of two wiring planes. Set 502 extends transverse to the sets 501 and 503. FIG. 12 shows a set 601 of three wiring planes extending in a different direction than the set 502 of two wiring planes.

Figure 13:
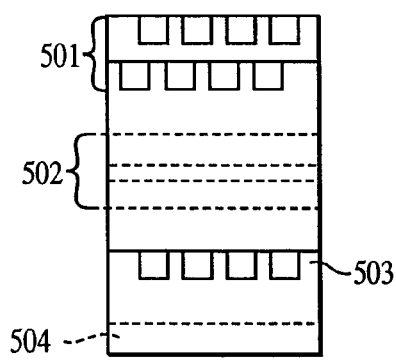
Figure 14:
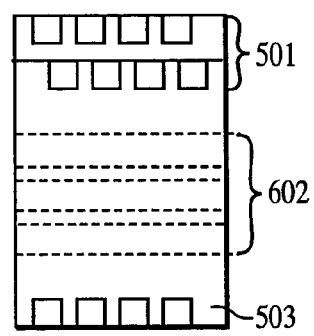

FIGS. 13–14 illustrate two examples of six wiring planes laid down according to the invention. Specifically, FIG. 13 illustrates the set 501 of two wiring planes and the set 503 having a single wiring plane extending in the same direction. Further, the set 502 of two wiring planes, which is sandwiched by the sets 501, 503, is shown extending in the same direction as a set 504 having a single wiring plane. FIG. 14 shows the set 501 adjacent to the set 602, which itself is adjacent to the set 503.

Figure 15:
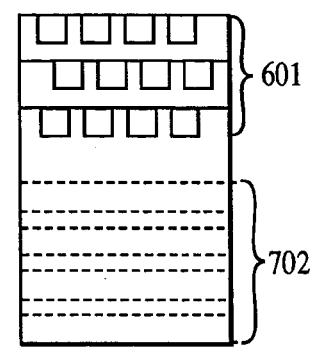
Figure 16:
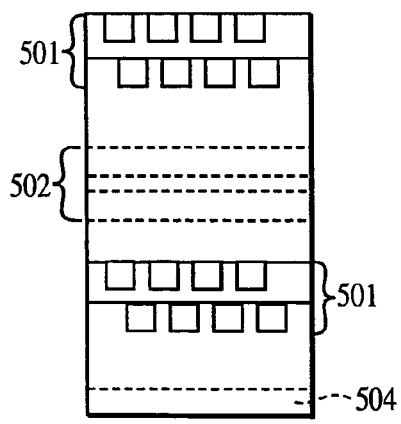
Figure 17:
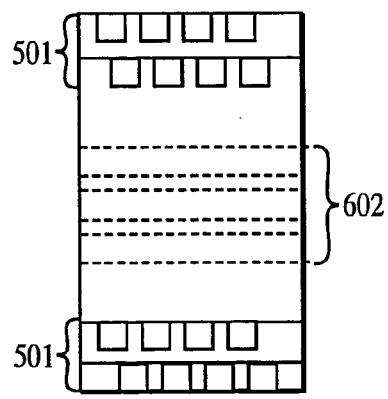

FIGS. 15–17 illustrate examples of seven wiring planes laid out in accordance with the invention. FIG. 15 shows the set 601 of three wiring planes adjacent to and extending transversely to a set 702 of four wiring planes. FIG. 16 shows a pair of the sets 501 on either side of the set 502, with the set 504 being adjacent to the lower of the two sets 501. FIG. 17 shows a pair of the sets 501 sandwiching the set 602.

Figure 18:
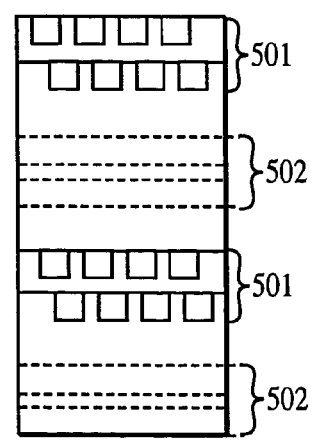
Figure 19:
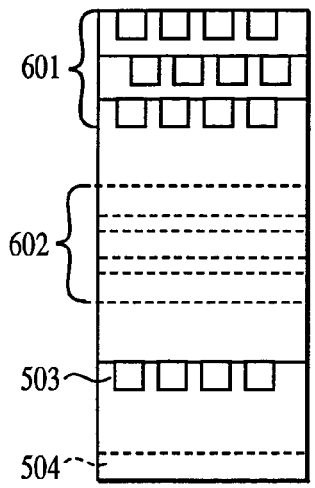
Figure 20:
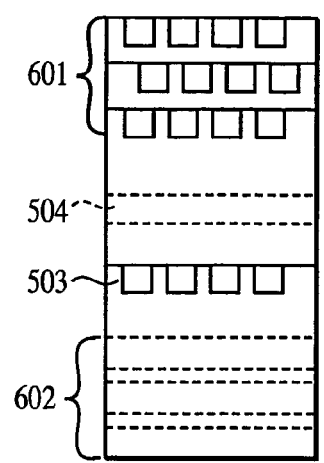
Figure 21:
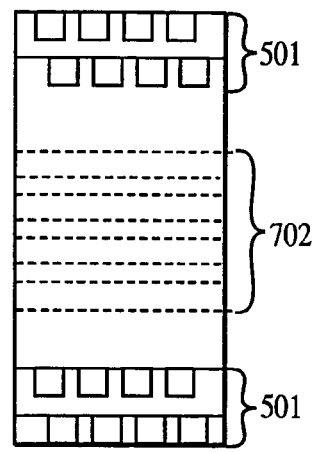

FIGS. 18–21 illustrate four examples of eight wiring planes laid out according to the invention. FIG. 18 shows a pair of sets 501 and a pair of sets 502 interspersed. FIG. 19 shows the set 601 adjacent and above the set 602 and the sets 503 and 504. FIG. 20 shows the set 601 and the set 602 acting as bookends for the sets 504 and 503. FIG. 21 shows a pair of the sets 501 sandwiching the set 702.

Figure 22:
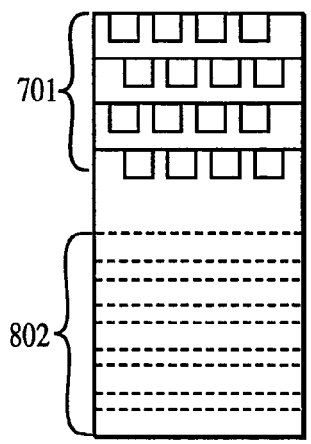
Figure 23:
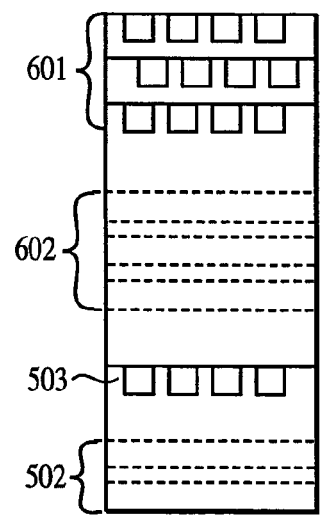
Figure 24:
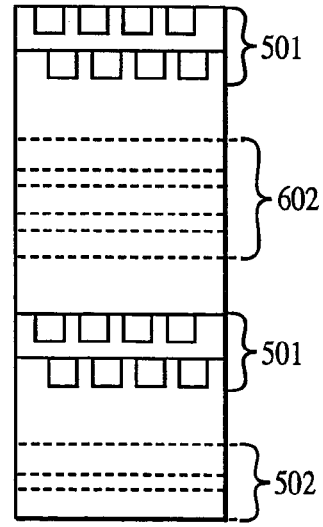

FIGS. 22–24 show examples of nine wiring planes laid out according to the invention. Specifically, FIG. 22 shows a set 701 of four wiring planes adjacent to a set 802 of five wiring planes. FIG. 23 shows the set 601 adjacent to the set 602. Further, the set 503 is sandwiched between the set 602 and the set 502. FIG. 24 shows a pair of sets 501 sandwiching the set 602, with the set 502 adjacent and below the lower of the sets 501.

Figure 25:
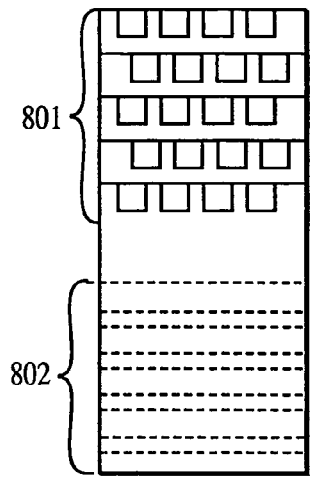
Figure 26:
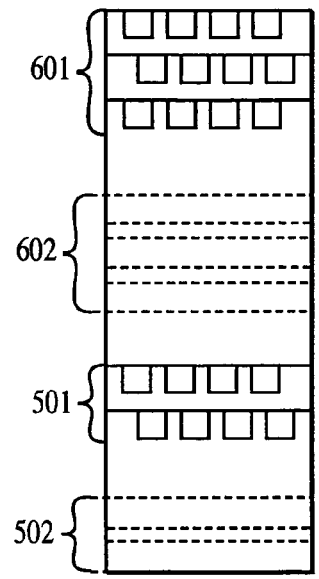
Figure 27:
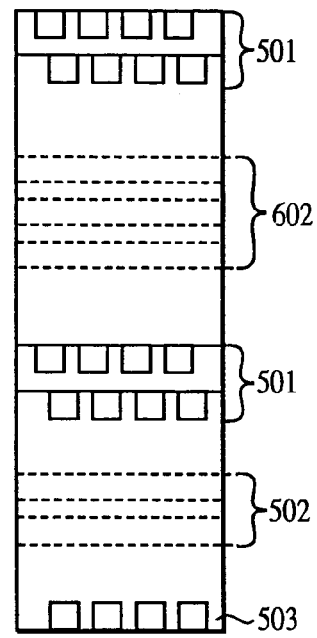
Figure 28:
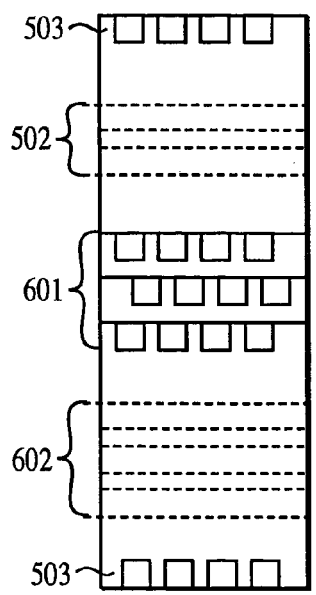
Figure 29:
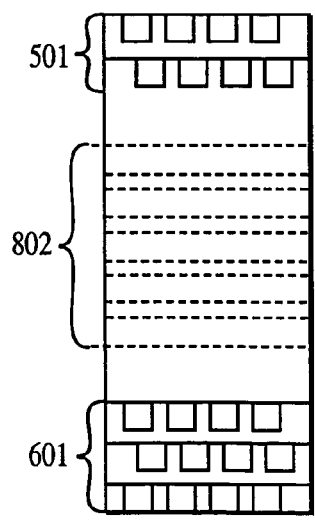
Figure 30:
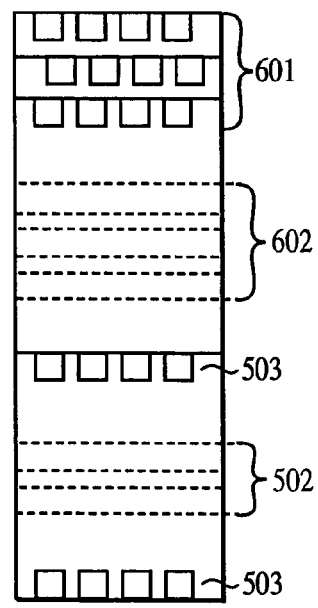

FIGS. 25–30 show examples of ten wiring planes laid down according to the invention. FIG. 25 shows a set 801 of five wiring planes adjacent to the set 802. FIG. 26 shows the set 601 adjacent to the set 602, which is adjacent to the set 501, which itself is adjacent to the set 502. FIG. 27 shows a pair of sets 501 sandwiching the set 602, and beneath the lower of the sets 501 is the set 502 and the set 503. FIG. 28 shows the set 503 adjacent to the set 502. Beneath the set 502 are the set 601, the set 602, and a second set 503. FIG. 29 shows the set 501 adjacent to the set 802, which is adjacent to the set 601. FIG. 30 shows the set 601 adjacent to the set 602. Further, a pair of the sets 503 sandwich the set 502.

Figure 31:
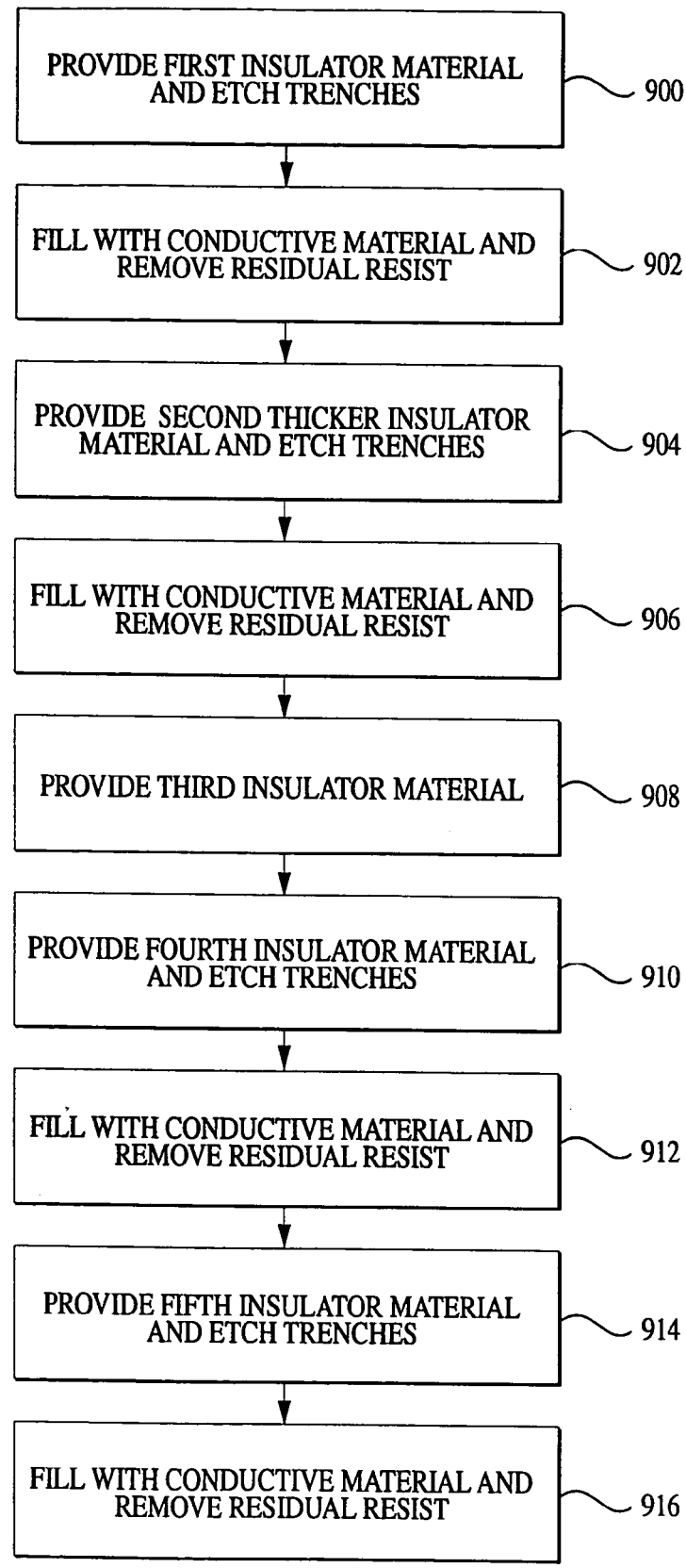
FIG. 31 is a flow diagram of the method for forming multi-layer wiring patterns in accordance with exemplary embodiments of the invention.

With reference to FIG. 31, next will be described an exemplary method for forming the multi-layer wiring designs illustrated in FIG. 7. As a first step 900, a first insulator material, such as the intralayer dielectric material 36, is provided over the substrate 13. This layer is then masked and trenches or channels 38 are etched therein. At step 902, a conductive material 40, such as, for example, copper is deposited in the trenches 38 of the first insulator material 36 and then the remaining masking material is removed. At step 904, a second, thicker insulator material, such as the intralayer dielectric material 541 and 534, is provided. This layer is then masked and trenches 38 are etched therein. The trenches 38 in layer 541 are offset from those in material 36. A conductive material 40 is deposited in the trenches at step 906. A third insulator material thicker than the insulator materials 36, 534, 541, such as the intralayer dielectric material 542, is applied at step 908, and at step 910 a fourth insulator material, such as the intralayer dielectric material 532, is applied, masked, and trenches 38 are etched therein. The trenches 38 of the fourth insulator material are filled with a conductive material 40 at step 912. A fifth insulator material, such as the intralayer dielectric material 30, is applied, masked and trenches 38 are etched therein at step 914. The trenches 38 in layer 30 are offset from the trenches 38 in layer 532. At step 916, a conductive material 40 is deposited in the trenches 38. The steps as described with reference to the integrated circuit portion 500 (FIGS. 7, 31) can be modified and/or expanded upon in order to form the integrated circuits described herein.

While the foregoing has described in detail preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, while the multi-level integrated circuits described herein generally have had between four and eight wiring planes, the number of wiring planes may be less than four or more than eight. Further, while the wiring channels 38, 138, 238 are shown with a rectangular profile, it is to be understood that a circular, oval, or other profile is within the scope of the invention. Additionally, the number of insulating material layers and the thicknesses of the insulating materials can vary within the scope of the invention. For example, while the invention has been shown with separating insulative layers between two adjacent insulative layers in which conductors are formed, it is possible to remove any separating insulative layers and make the upper insulating layer containing conductors thicker. Accordingly, the invention is not to be seen as limited by the foregoing description, but is only limited by the scope of the appended claims.

The invention claimed is:

1. A method for operating an integrated circuit having a plurality of wiring planes, each said plane including a plurality of wiring channels, said method comprising:
providing a first layer of insulator material;
providing a first plurality of wires on said first layer of insulator material;
providing a second layer of insulator material over said first layer of insulator material, said second layer of insulator material being thicker than said first layer of insulator material; and
providing a second plurality of wires on said second layer of insulator material, wherein said second plurality of wires extend in the same direction as said first plurality of wires and are each offset from said first plurality of wires, whereby a capacitive-resistance effect of the circuit is inhibited while the heat conductivity of the circuit is enhanced as compared to without said second plurality of wires each being offset from said first plurality of wires.

2. The method of claim 1, wherein said providing of a first plurality of wires includes providing copper wires.

3. The method of claim 1, further comprising:
providing a third layer of insulator material over said second layer of insulator material;
providing a fourth layer of insulator material over said third layer of insulator material; and
providing a third plurality of said wiring channels in said fourth layer of insulator material in a second direction transverse to said first direction.

4. The method of claim 3, further comprising:
providing a fifth layer of insulator material over said fourth layer of insulator material; and
providing a fourth plurality of said wiring channels in said fifth layer of insulator material in either said first or said second direction.

5. A method for operating an integrated circuit having a plurality of wiring planes, each said plane including a plurality of wiring channels, said method comprising:
providing a first layer of insulator material;
masking said first layer of insulator material and etching a first plurality of said wiring channels therein in a first direction;
filling said first plurality of wiring channels with conductive material;
providing a second layer of insulator material over said first layer of insulator material, said second layer of insulator material being thicker than said first layer of insulator material;
masking said second layer of insulator material and etching a second plurality of said wiring channels therein in said first direction; and
filling said second plurality of wiring channels with conductive material, wherein said second plurality of wiring channels are each offset from said first plurality of wiring channels, whereby a capacitive-resistance effect of the circuit is inhibited while the heat conductivity of the circuit is enhanced as compared to without said second plurality of wires each being offset from said first plurality of wires.

6. The method of claim 5, wherein said providing of a first plurality of wires includes providing copper wires.

7. The method of claim 6, further comprising:
providing a third layer of insulator material over said second layer of insulator material;
providing a fourth layer of insulator material over said third layer of insulator material;
masking said fourth layer of insulator material and etching a third plurality of said wiring channels therein in a second direction transverse to said first direction; and
filling said third plurality of wiring channels with conductive material.

8. The method of claim 7, further comprising:
providing a fifth layer of insulator material over said fourth layer of insulator material;
masking said fifth layer of insulator material and etching a fourth plurality of said wiring channels in either said first or said second direction; and
filling said fourth plurality of wiring channels with conductive material.

* * * * *